United States Patent
Sakai et al.

(10) Patent No.: US 11,950,365 B2
(45) Date of Patent: Apr. 2, 2024

(54) FLEXIBLE PRINTED CIRCUIT BOARD AND METHOD OF MANUFACTURING SAME

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Shoichiro Sakai, Osaka (JP); Koji Nitta, Osaka (JP); Yoshio Oka, Osaka (JP); Junichi Motomura, Shiga (JP); Masanao Yamashita, Osaka (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 95 days.

(21) Appl. No.: 17/753,219

(22) PCT Filed: Dec. 16, 2020

(86) PCT No.: PCT/JP2020/046964
§ 371 (c)(1),
(2) Date: Feb. 24, 2022

(87) PCT Pub. No.: WO2021/140855
PCT Pub. Date: Jul. 15, 2021

(65) Prior Publication Data
US 2022/0295637 A1 Sep. 15, 2022

(30) Foreign Application Priority Data
Jan. 10, 2020 (JP) .................................. 2020-003240

(51) Int. Cl.
*H05K 1/16* (2006.01)
*H05K 1/02* (2006.01)
(Continued)

(52) U.S. Cl.
CPC ............. *H05K 1/165* (2013.01); *H05K 1/028* (2013.01); *H05K 1/116* (2013.01); *H05K 3/061* (2013.01); *H05K 2203/0723* (2013.01)

(58) Field of Classification Search
CPC ..................... H05K 1/165; H05K 2201/09736
See application file for complete search history.

(56) References Cited

U.S. PATENT DOCUMENTS

| 2001/0016407 A1* | 8/2001 | Schoenfeld ....... H01L 21/76838 257/E23.152 |
| 2014/0353022 A1* | 12/2014 | Morita ................... H05K 1/165 174/260 |

(Continued)

FOREIGN PATENT DOCUMENTS

| JP | S59-038068 | 10/1984 |
| JP | H11-113203 | 4/1999 |

(Continued)

*Primary Examiner* — Hoa C Nguyen
*Assistant Examiner* — John B Freal
(74) *Attorney, Agent, or Firm* — IPUSA, PLLC (57) ABSTRACT

A flexible printed circuit board includes: a base film having a hole for forming a through hole; and a coil-shaped wiring layer layered on at least one surface side of the base film, wherein the wiring layer includes a land portion arranged at an inner peripheral surface of the hole and at a peripheral portion of the hole of the base film, and a winding portion arranged in a spiral shape with the land portion as an inside end portion or an outside end portion, wherein the winding portion includes a first winding portion that is an outermost circumference and a second winding portion that is inside relative to the outermost circumference, and wherein a ratio of an average thickness of the land portion to an average thickness of the second winding portion is 1.1 or more and 5 or less.

8 Claims, 5 Drawing Sheets

(51) Int. Cl.
*H05K 1/11* (2006.01)
*H05K 3/06* (2006.01)

(56) References Cited

U.S. PATENT DOCUMENTS

| | | | |
|---|---|---|---|
| 2015/0340149 A1* | 11/2015 | Lee | H05K 1/111 336/200 |
| 2017/0135206 A1* | 5/2017 | Ueda | H05K 3/24 |
| 2018/0174748 A1* | 6/2018 | Horikawa | G06K 19/07783 |
| 2018/0240760 A1* | 8/2018 | Kasai | H01L 23/12 |
| 2020/0015353 A1 | 1/2020 | Takahashi et al. | |

FOREIGN PATENT DOCUMENTS

| | | |
|---|---|---|
| JP | 2016-009854 | 1/2016 |
| JP | 2018-195681 | 12/2018 |

* cited by examiner

FLEXIBLE PRINTED CIRCUIT BOARD AND METHOD OF MANUFACTURING SAME

TECHNICAL FIELD

The present disclosure relates to a flexible printed circuit board and a method of manufacturing the same.

The present application is based on and claims priority to Japanese Patent Application No. 2020-003240, filed on Jan. 10, 2020, the entire contents of the Japanese Patent Application are hereby incorporated herein by reference.

BACKGROUND ART

Flexible printed circuit boards are widely used to constitute circuitry of various electronic devices. As the size of electronic devices has been reduced in recent years, the size of flexible printed circuit boards is significantly reduced and the density of interconnects of a flexible printed circuit board significantly increases.

As such a small flexible printed circuit board, a flexible printed circuit board including a sheet-like insulating base material and interconnects layered on a surface of the substrate by plating has been proposed (see Japanese Laid-Open Patent Publication No. 2018-195681). In this flexible printed circuit board, the thickness of the plating film, that is, the thickness of the wiring layer is made uniform.

PRIOR ART DOCUMENTS

Patent Documents

[Patent Document 1] Japanese Laid-open Patent Publication No. 2018-195681

SUMMARY OF THE INVENTION

According to one aspect of the present disclosure, a flexible printed circuit board includes: a base film having a hole for forming a through hole; and a coil-shaped wiring layer layered on at least one surface side of the base film, wherein the wiring layer includes a land portion arranged at an inner peripheral surface of the hole and at a peripheral portion of the hole of the base film, and a winding portion arranged in a spiral shape with the land portion as an inside end portion or an outside end portion, wherein the winding portion includes a first winding portion that is an outermost circumference and a second winding portion that is inside relative to the outermost circumference, and wherein a ratio of an average thickness of the land portion to an average thickness of the second winding portion is 1.1 or more and 5 or less.

According to another aspect of the present disclosure, a method of manufacturing a flexible printed circuit board including a base film having a hole for forming a through hole; and a coil-shaped wiring layer layered on at least one surface side of the base film, wherein the wiring layer includes a land portion arranged at an inner peripheral surface of the hole and at a peripheral portion of the hole of the base film, and a winding portion arranged in a spiral shape with the land portion as an inside end portion or an outside end portion, wherein the winding portion includes a first winding portion that is an outermost circumference and a second winding portion that is inside relative to the outermost circumference, and wherein a ratio of an average thickness of the land portion to an average thickness of the second winding portion is 1.1 or more and 5 or less, wherein the method comprises: a first plating step of forming a first plating body including a lower land layer of the land portion and a lower winding layer of the winding portion by electroplating a first metal material on a conductive underlayer of the base film having the hole for forming the through hole using a resist pattern, the conductive underlayer being layered on at least one surface side of the base film; a removing step of removing, after the first plating step, the resist pattern and a region of the conductive underlayer on which the first plating body is not layered; and a second plating step of forming, after the removing step, a second plating body including an upper land layer of the land portion and an upper winding layer of the winding portion by electroplating a second metal material on the first plating body; wherein in the first plating step, the first metal material is electroplated on the conductive underlayer so that a second plating amount for forming the lower land layer is greater than a first plating amount for forming an inside relative to the outermost circumference of the lower winding layer, wherein the land portion is formed by a portion of the conductive underlayer, the lower land layer and the upper land layer, and wherein the winding portion is formed by another portion of the conductive underlayer, the lower winding layer and the upper winding layer.

EMBODIMENT FOR CARRYING OUT THE INVENTION

Here, for a flexible printed wiring board, if a conduction failure occurs or the electric resistance is too large, a connection failure may occur. Therefore, for a flexible printed circuit board, excellent connection reliability is desired.

Therefore, an object is to provide a flexible printed circuit board that is excellent in the connection reliability and a method of manufacturing the same.

Effect of the Present Disclosure

A flexible printed circuit board according to one aspect of the present disclosure is excellent in the connection reliability. A method of manufacturing a flexible printed circuit board according to another aspect of the present disclosure enables to manufacture a flexible printed circuit board that is excellent in the connection reliability.

Description of Embodiments of the Present Disclosure

According to one aspect of the present disclosure, a flexible printed circuit board includes: a base film having a hole for forming a through hole; and a coil-shaped wiring layer layered on at least one surface side of the base film, wherein the wiring layer includes a land portion arranged at an inner peripheral surface of the hole and at a peripheral portion of the hole of the base film, and a winding portion arranged in a spiral shape with the land portion as an inside end portion or an outside end portion, wherein the winding portion includes a first winding portion that is an outermost circumference and a second winding portion that is inside relative to the outermost circumference, and wherein a ratio of an average thickness of the land portion to an average thickness of the second winding portion is 1.1 or more and 5 or less.

Here, for a flexible printed circuit board including a wiring layer having a coil-shaped winding portion, in a case in which the average thickness of the land portion in the wiring layer is small, the amount of metal layered on the inner peripheral surface of the hole decreases, and a conduction failure is likely to occur at the through hole.

On the other hand, in the flexible printed circuit board, since the ratio is within the above described range, the average thickness of the land portion is sufficiently large, and thus the amount of metal layered on the inner peripheral surface of the hole can be increased. Accordingly, a conduction failure at the through hole can be reduced. Therefore, the flexible printed circuit board is excellent in the connection reliability.

The ratio of the average thickness of the first winding portion to the average thickness of the second winding portion may be 1.1 or more and 5 or less.

When the ratio is within the above described range, the average thickness of the outermost circumferential first winding portion is sufficiently increased, and the electrical resistance of the first winding portion can be reduced. Therefore, the electrical resistance of the wiring layer can be reduced.

The flexible printed circuit board may further include one or more dummy wiring layers that are arranged in a region outside the wiring layer on the base film with an interval from the wiring layer.

As described above, since the flexible printed circuit board includes a dummy wiring layer, the wiring layer having a large average thickness of the outermost circumferential first winding portion is easily formed. Accordingly, the flexible printed circuit board is further excellent in the connection reliability.

The ratio of a second area of a layered region of the dummy wiring layer to a first area of a region up to 2 mm by a shortest distance from the wiring layer toward outside thereof in the base film may be 20% or more and less than 50%.

As described above, since the ratio of the second area to the first area is within the above described range, the wiring layer having a large average thickness of the outermost circumferential first winding portion is easily formed. Accordingly, the flexible printed circuit board is further excellent in the connection reliability.

According to another aspect of the present disclosure, a method of manufacturing a flexible printed circuit board including a base film having a hole for forming a through hole; and a coil-shaped wiring layer layered on at least one surface side of the base film, wherein the wiring layer includes a land portion arranged at an inner peripheral surface of the hole and at a peripheral portion of the hole of the base film, and a winding portion arranged in a spiral shape with the land portion as an inside end portion or an outside end portion, wherein the winding portion includes a first winding portion that is an outermost circumference and a second winding portion that is inside relative to the outermost circumference, and wherein a ratio of an average thickness of the land portion to an average thickness of the second winding portion is 1.1 or more and 5 or less, wherein the method comprises: a first plating step of forming a first plating body including a lower land layer of the land portion and a lower winding layer of the winding portion by electroplating a first metal material on a conductive underlayer of the base film having the hole for forming the through hole using a resist pattern, the conductive underlayer being layered on at least one surface side of the base film; a removing step of removing, after the first plating step, the resist pattern and a region of the conductive underlayer on which the first plating body is not layered; and a second plating step of forming, after the removing step, a second plating body including an upper land layer of the land portion and an upper winding layer of the winding portion by electroplating a second metal material on the first plating body; wherein in the first plating step, the first metal material is electroplated on the conductive underlayer so that a second plating amount for forming the lower land layer is greater than a first plating amount for forming an inside relative to the outermost circumference of the lower winding layer, wherein the land portion is formed by a portion of the conductive underlayer, the lower land layer and the upper land layer, and wherein the winding portion is formed by another portion of the conductive underlayer, the lower winding layer and the upper winding layer.

According to the method of manufacturing a flexible printed circuit board, a flexible printed circuit board as described above can be manufactured. That is, a flexible printed circuit board that is excellent in the connection reliability can be manufactured.

The flexible printed circuit board may further include a dummy wiring layer that is arranged in a region outside the wiring layer on the base film with an interval from the wiring layer, in the first plating step, a dummy plating body may be formed on the conductive underlayer in addition to the first plating body, and the dummy wiring layer that is electrically isolated may be formed by a portion of a region of the conductive underlayer on which the land portion and the winding portion are not layered and the dummy plating body.

As described above, by forming the dummy plating body in the first plating step, the wiring layer having a large average thickness of the outermost circumferential first winding portion is easily formed. Therefore, according to the method of manufacturing the flexible printed circuit board, it is possible to manufacture the flexible printed circuit board that is further excellent in the connection reliability.

Here, the "outermost circumference of a winding portion" means a portion where only the inside faces another portion of the winding portion. Here, the "average thickness" means, for each of a land, a first winding portion, and a second winding portion, a respective average value of the thickness measured at desired ten points. The "thickness" means a distance between the base film and an upper edge of the wiring layer in a direction perpendicular to the base film. Also, in the following, the "line width" means a dimension in a direction perpendicular to the longitudinal direction (winding direction) of a winding portion. The "interval" means a distance between adjacent surfaces facing each other in a winding portion, and the "average interval" means an average value of distances between the adjacent surfaces in the longitudinal direction. The "average line width" means a value in the longitudinal direction obtained by averaging the maximum width of the winding portion in a cross section perpendicular to the longitudinal direction.

Details of Embodiments of the Present Disclosure

Hereinafter, embodiments of a flexible printed circuit board and a method of manufacturing the same in accordance with the present disclosure will be described in detail with reference to the drawings. It should be noted that in the present embodiment, the "front surface side" refers to the side on which a wiring layer is layered in the thickness direction of a base film, and the front and back in the embodiment does not determine the front and back in a use state of the flexible printed circuit board.

First Embodiment

Flexible Printed Circuit Board

Figure 1:
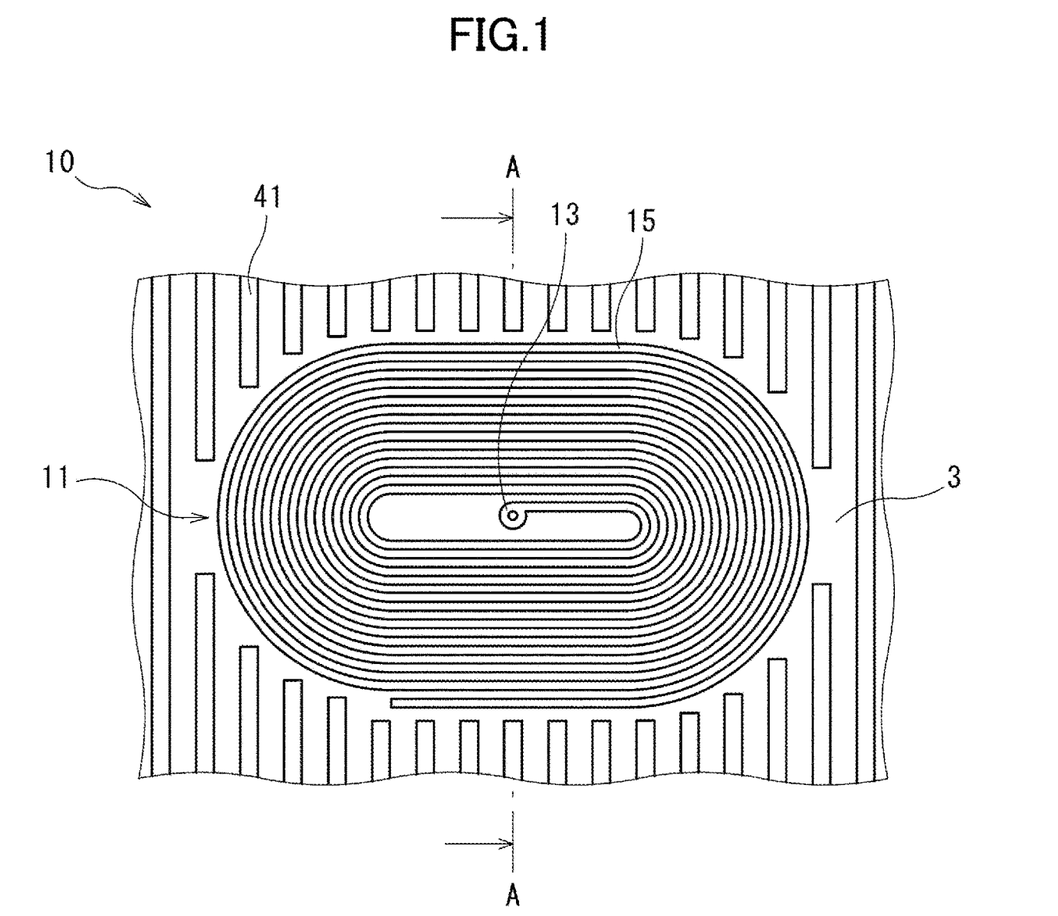
FIG. 1 is a schematic top view illustrating a flexible printed circuit board according to a first embodiment.
Figure 2:
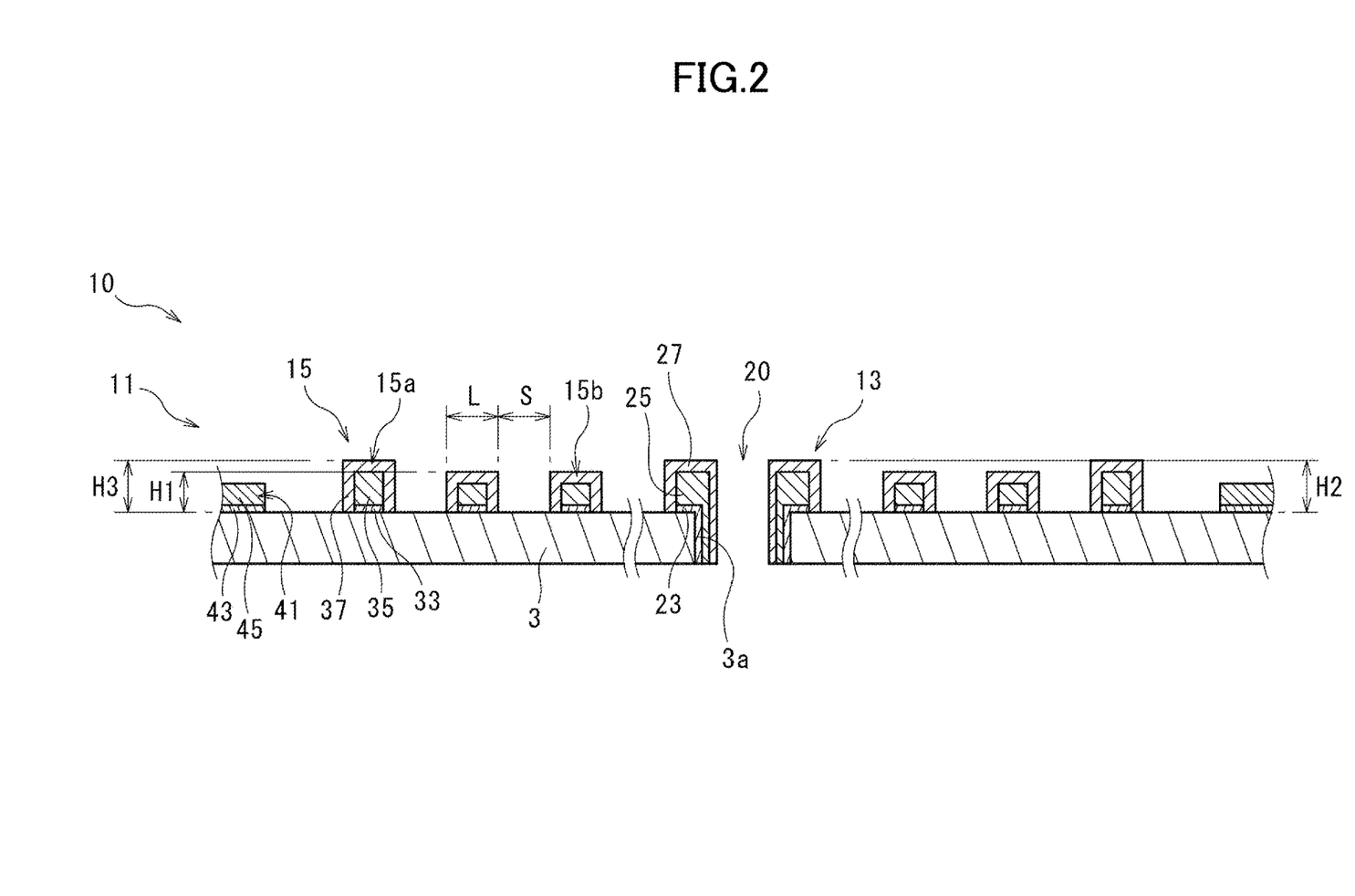
FIG. 2 is a schematic cross-sectional view illustrating the flexible printed circuit board of FIG. 1.

As illustrated in FIG. 1 and FIG. 2, a flexible printed circuit board 10 according to the present embodiment includes a base film 3 having an insulating property and a wiring layer 11 that is layered on one surface side (front surface side) of the base film 3. The flexible printed circuit board 10 further includes a dummy wiring layer 41 that is arranged in a region outside the wiring layer 11 on the base film 3 with an interval from the wiring layer 11. The flexible printed circuit board 10 may further include a cover film on the front surface side of the base film 3 or the wiring layer 11.

Base Film

The base film 3 is a layer made of a synthetic resin having an insulating property. The base film 3 also has a flexible property. The base film 3 is also a base material for forming the wiring layer 11. The base film 3 has a hole 3a for forming a through hole 20. As a material of forming the base film 3, a low dielectric constant synthetic resin film formed in a sheet shape may be employed, although the material is not particularly limited as long as the base film is made of a material having an insulating property and a flexible property. Examples of the main component of the synthetic resin film include polyimides, polyethylene terephthalates, liquid crystal polymers, fluoropolymers, and the like. The term "main component" means a component contained with the highest percentage and, for example, a component occupying 50 mass % or more of the forming materials. The base film 3 may contain another resin other than example resins such as polyimides, and may contain antistatic agents, and the like.

The lower limit of the average thickness of the base film 3 is not particularly limited, but is preferably 3 μm, more preferably 5 μm, and even more preferably 10 μm. The upper limit of the average thickness of the base film 3 is not particularly limited, but is preferably 200 μm, more preferably 150 μm, and even more preferably 100 μm. If the average thickness of the base film 3 is less than the lower limit, the insulation strength and mechanical strength of the base film 3 may be insufficient. If the average thickness of the base film 3 exceeds the upper limit, the flexible printed circuit board 10 may become unnecessarily thick. Here, the "average thickness" means an average value of the thickness measured at desired ten points, as described above.

A through hole 20 may be formed in a suitable size at a suitable location.

Wiring Layer

The wiring layer 11 is layered on the front surface side of the base film 3, either directly or through another layer. The wiring layer 11 is coil-shaped. The wiring layer 11 includes a land portion 13 arranged at an inner peripheral surface of the hole 3a for forming the through hole 20 and at a peripheral portion of the hole 3a of the base film 3, and a winding portion 15 arranged in a spiral shape with the land portion 13 as an inside end portion or an outside end portion. The winding portion 15 includes a first winding portion 15a, which is the outermost circumference, and a second winding portion 15b, which is inside relative to the outermost circumference. The ratio of the average thickness H2 of the land portion to the average thickness H1 of the second winding portion 15b is 1.1 or more and 5 or less. The ratio of the average thickness H3 of the first winding portion 15a to the average thickness H1 of the second winding portion 15b is not particularly limited, and, for example, in the present embodiment, the ratio is 1.1 or more and 5 or less. It should be noted that the wiring layer 11 may have the land portion 13 as the outside end portion. The wiring layer 11 may also have two land portions as the inside end portion and the outside end portion, respectively.

The land portion 13 is formed by a first conductive underlayer 23 layered on the front surface side of the base film 3 and a lower land layer 25 layered on the side (the front surface side) of the first conductive underlayer 23 opposite to the base film 3. The first conductive underlayer 23 is also layered on the inner peripheral surface of the hole 3a. The winding portion 15 is formed by a second conductive underlayer 33 layered on the front surface side of the base film 3, a lower winding layer 35 layered on the side (the front surface side) of the second conductive underlayer 33 opposite to the base film 3, and an upper winding layer 37 layered on the side (the front surface side) of the lower winding layer 35 opposite to the second conductive underlayer 33. The upper winding layer 37 is formed so that the average thickness of the region constituting a portion of the land portion 13 in the upper winding layer 37 and the average thickness of the region constituting a portion of the first winding portion 15a are larger than the average thickness of the region constituting a portion of the second winding portion 15b in the upper winding layer 37. The wiring layer 11 may be, for example, a coil wire for transmitting a current for generating a magnetic field.

Examples of the material forming the first conductive underlayer 23 and the second conductive underlayer 33 include copper (Cu), silver (Ag), gold (Au), nickel (Ni), titanium (Ti), chromium (Cr), alloys of these metals, stainless steel, and the like. For the forming material, it is preferable that the first conductive underlayer 23 and the second conductive underlayer 33 include a layer (first layer) containing at least one kind selected from the group consisting of nickel, chromium, titanium, and silver on the side in contact with the base film 3 (e.g., polyimide) in order to suppress thermal deterioration of the adhesion force of the wiring layer 11 to the base film 3. Further, it is more preferable that the first conductive underlayer 23 and the second conductive underlayer 33 contain a layer (first layer) containing at least one kind selected from nickel and chromium that are easily removed and that easily maintain an insulating property. In addition, it is more preferable that the first conductive underlayer 23 and the second conductive underlayer 33 include, on the upper side of the first layer (the side opposite to the base film 3), a layer (second layer) containing copper as the main component. By arranging a layer containing copper as the main component, the work time required for forming the wiring layer 11 by electroplating can be shortened.

For example, the lower limit of the average thickness of the first layer is preferably 1 nm and more preferably 2 nm. The upper limit of the average thickness of the first layer is preferably 15 nm and more preferably 8 nm. If the average thickness is less than the lower limit, thermal degradation of the adhesive force of the wiring layer 11 to the base film 3 may not be easily suppressed. If the average thickness exceeds the upper limit, the first layer may not be easily removed and the insulating property of the wiring layer 11 may not be sufficiently maintained. It should be noted that the first layer may be formed by a sputtering method, an electroplating method, an electroless plating method, or the like.

For example, the lower limit of the average thickness of the second layer is preferably 0.1 μm and more preferably 0.2 μm. The upper limit of the average thickness of the second layer is preferably 2 μm and more preferably 1 μm. If the average thickness is less than the lower limit, the time required for forming the wiring layer 11 by electroplating may be excessively long. If the average thickness exceeds the upper limit, the second layer may not be easily removed and the insulating property in the winding portion 15 may not be sufficiently maintained. The second layer is preferably formed by a sputtering method, an electroplating method, an electroless plating method, or the like, and may be formed by combining these methods. In particular, it is preferable that an electroless copper plating layer is arranged on the uppermost surface side of the first conductive underlayer 23 and the second conductive underlayer 33, whereby, when the inner layer is formed by a sputtering method, a defect or the like that may be caused by the sputtering method can be covered.

Examples of the first metal material for forming the lower layer land layer 25 and the lower winding layer 35 include copper, aluminum, silver, gold, nickel, alloys of these metals, and the like. Among these, copper or a copper alloy is preferable from the viewpoint of having favorable conductivity and reducing cost. For example, the lower layer land layer 25 and the lower winding layer 35, viewed in a direction perpendicular to the base film 3, are formed in the same shape as the first conductive underlayer 23 and the second conductive underlayer 33.

The second metal material for forming the upper layer land layer 27 and the upper winding layer 37 may be, for example, similar to those of the first metal material described above. It is preferable that the second metal material is of the same kind as the first metal material. For example, the upper layer land layer 27 and the upper winding layer 37 are formed to have a line width greater than the line width of the lower layer land layer 25 and the lower winding layer 35 viewed in a direction perpendicular to the base film 3.

Land Portion

The average thickness H2 of the land portion 13 may be set as appropriate so that the ratio of the average thickness H2 of the land portion 13 to the average thickness H1 of the second winding portion 15b described above is greater than or equal to 1.1 and less than or equal to 10. For example, the lower limit of the average thickness H2 of the land portion 13 is preferably 5 μm, more preferably 10 μm, and even more preferably 20 μm. The upper limit of the average thickness H2 of the land portion 13 is preferably 100 μm, more preferably 75 μm, and even more preferably 50 μm. When the average thickness H2 is less than the lower limit, it may be difficult to adhere, to the inner peripheral surface of the hole 3a, the first metal material and the second metal material with a sufficient amount (coating amount). On the other hand, when the average thickness H2 exceeds the upper limit, the adhesion amount of the first metal material and the second metal material to the inner peripheral surface of the hole 3a may become excessively large. The average thickness H2 is obtained by exposing a cross-section of the circuit board 10 with a cross-sectional processing device, such as a microtome, measuring the thickness by the cross-sectional observations at desired ten points at the land portion 13, and calculating the average value of the measurement results.

The maximum line width of the land portion 13, the ratio of the average thickness H2 to this maximum line width (aspect ratio), and the like may be set as appropriate.

Winding Portion

The lower limit of the average line width L of the winding portion 15 is preferably 5 μm, more preferably 10 μm, and even more preferably 15 μm. The upper limit of the average line width L of the winding portion 15 is preferably 100 μm, more preferably 75 μm, and even more preferably 50 μm. When the average line width L of the winding portion 15 is less than the lower limit, there is a risk that the electrical resistance of the winding portion 15 may become too large or the mechanical strength may be insufficient. On the other hand, when the average line width L of the winding portion 15 exceeds the upper limit, space saving may not be achieved. The "average line width" is a value obtained by exposing a cross-section of the circuit board 10 with a cross-sectional processing device, such as a microtome, measuring the length of a portion at which the width is the largest in the winding portion 15 by a microscope or the like, and calculating the average value of the measured values.

The lower limit of the average interval S of the winding portion 15 is preferably 5 μm, more preferably 10 μm, and even more preferably 15 μm. The upper limit of the average interval S of the winding portion 15 is preferably 50 μm and more preferably 25 μm. If the average interval S of the winding portion 15 is less than the lower limit, a short circuit may occur. If the average interval S of the winding portion 15 exceeds the upper limit, there is a possibility that space saving may not be achieved. The "average interval" is a value obtained by exposing a cross-section of the circuit board 10 with a cross-sectional processing device such as a microtome, measuring the length of a portion with the smallest internal in a gap in the winding portion 15 by a microscope or the like, and calculating the average value of the measured values.

The lower winding layer 35 and the upper winding layer 37 are much thicker than the second conductive underlayer 33. Thus, the thickness of the winding portion 15 may be determined mainly by the thickness of the lower winding layer 35 and the upper winding layer 37.

Second Winding Portion

The average thickness H1 of the inner second winding portion 15b in the winding portion 15 may be set as appropriate so that the ratio of the average thickness H2 of the land portion 13 and the average thickness H3 of the outermost circumferential first winding portion 15a to the average thickness H1 of the second winding portion 15b is 1.1 or more and 5 or less. For example, the lower limit of the average thickness H1 of the second winding portion 15b is preferably 10 μm, is more preferably 15 μm, and even more preferably 20 μm. The upper limit of the average thickness H1 of the second winding portion 15b is preferably 100 μm, is more preferably 80 μm, and even more preferably 60 μm. When the average thickness H1 is less than the lower limit, the electrical resistance of the second winding portion 15b, may increase. On the other hand, when the average thickness H1 exceeds the upper limit, the line width needs to be increased in order to form the second winding portion 15b, and space saving may not be achieved. The "average thickness" is obtained by exposing a cross-section of the circuit board 10 with a cross-sectional processing device, such as a microtome, measuring the thickness by the cross-sectional observations at desired ten points at the second winding portion 15, and calculating the average value of the measurement results. It should be noted that in the following, the "average thickness" of another member or the like is a value measured similarly.

The lower limit of the ratio of the average thickness H1 to the minimum line width (which is not illustrated) of the second winding portion 15 (aspect ratio), is preferably 0.3, more preferably 0.5, and even more preferably 0.7. The upper limit of the ratio is preferably 5, more preferably 3, and even more preferably 2. If the ratio is less than the lower limit, there is a possibility that space saving cannot be achieved. If the ratio exceeds the upper limit, there is a possibility that space saving cannot be achieved. The "minimum line width" means the minimum value of the line width in the second winding portion 15b. The "minimum line width" is a value obtained by exposing a cross-section of the circuit board 10 with a cross-sectional processing device such as a microtome, and measuring the length of the narrowest portion of the second winding portion 15b by a microscope or the like. However, the "minimum line width" is the length of the narrowest portion in a region excluding a defective region of the second winding portion 15b. Here, the defective region to be excluded from measurements is a region that is recessed (missing) inward from at least one edge in the width direction when the microscope observation is performed as described above. Specifically, the defective region is a region at which the deepest portion in the width direction has a length (width) of ¼ or more with respect to the average line width of other regions (other than the defect region) in the longitudinal direction (winding direction) of the second winding portion 15b. The average line width is a value measured in a manner similar to the method of measuring the "average line width" described below. In the following, the "minimum line width" of another member or the like is also measured in substantially the same manner.

First Winding Portion

The average thickness H3 of the outermost circumferential first portion 15a may be set as appropriate so that the ratio of the average thickness H3 of the first winding portion 15a to the average thickness H1 of the second winding portion 15b is 1.1 or more and 5 or less. For example, the lower limit of the average thickness H3 of the first winding portion 15a is preferably 10 μm, and more preferably 20 μm, and even more preferably 30 μm. The upper limit of the average thickness H3 of the first winding portion 15a is preferably 120 μm, more preferably 100 μm, and even more preferably 80 μm. When the average thickness H3 is less than the lower limit, the electrical resistance of the first winding portion 15a may increase. On the other hand, when the average thickness H3 exceeds the upper limit, the line width needs to be increased in order to form the first winding portion 15a, and space saving may not be achieved.

The lower limit of the ratio of the average thickness H3 to the minimum line width (which is not illustrated) of the first winding portion 15a (aspect ratio) is preferably 0.5, more preferably 0.7, and even more preferably 1. The upper limit of the ratio is preferably 7, more preferably 5, and even more preferably 3. If the ratio is less than the lower limit, there is a possibility that space saving cannot be achieved. If the ratio exceeds the upper limit, there is also a possibility that space saving cannot be achieved.

Ratio of Average Thickness of Land Portion to Average Thickness of Second Winding Portion As described above, the lower limit of the ratio of the average thickness H2 of the land portion 13 to the average thickness H1 of the second winding portion 15b is 1.1, is preferably 1.3, is more preferably 1.5, and is further more preferably 2. As described above, the upper limit of the ratio is 5, is preferably 4, is more preferably 3. When the ratio is less than the lower limit, it may be difficult to adhere, to the inner peripheral surface of the hole 3a, the first metal material and the second metal material with a sufficient amount (coating amount). On the other hand, when the ratio exceeds the upper limit, the adhesion amount of the first metal material and the second metal material to the inner peripheral surface of the hole 3a becomes excessively large, and the flexible printed circuit board 10 becomes unnecessarily thick.

Ratio of Average Thickness of First Winding Portion to Average Thickness of Second Winding Portion As described above, the lower limit of the ratio of the average thickness H3 of the first winding portion 15a to the average thickness H1 of the second winding portion 15b is 1.1, is preferably 1.3, is more preferably 1.5, and is further more preferably 2. As described above, the upper limit of the ratio is 5, is preferably 4, and is more preferably 3. If the ratio is less than the lower limit, the electrical resistance of the wiring layer 11 may not be sufficiently reduced. On the other hand, if the ratio exceeds the above upper limit, sufficient flexibility of the flexible printed circuit board 10 may decrease.

Dummy Wiring Layer

The dummy wiring layer 41 is a wiring layer that is formed to be electrically isolated so as not to be conducted. The dummy wiring layer 41 includes a third conductive underlayer 43 and a dummy plating layer 45 layered on the third conductive underlayer 43.

As described above, when the flexible printed circuit board 10 includes the dummy wiring layer 41, it is easy to increase the average thickness H3 of the outermost circumferential first winding portion 15a of the winding portion 15 located in the vicinity of the dummy wiring layer 41. Specifically, when the upper winding layer 37 is formed, the plating amount of the outermost circumference located in the vicinity of the dummy wiring layer 41 can be made larger than its inside. Therefore, the flexible printed circuit board 10 having the higher connection reliability is easily formed.

The third conductive underlayer 43 is formed by a portion of the conductive underlayer M (see, e.g., FIG. 3), which will be discussed later. The third conductive underlayer 43 may be similar to the first conductive underlayer 23 and the second conductive underlayer 33. The average thickness of the third conductive underlayer 43 may be set similar to that of the first conductive underlayer 23 and the second conductive underlayer 33.

The forming material of the dummy plating layer 45 may be similar to the first metal material described above.

Since the thickness of the dummy plating layer 45 is much larger than the thickness of the third conductive underlayer 43, the thickness of the dummy wiring layer 41 may be determined by the thickness of the dummy plating layer 45. For example, the average thickness of the dummy wiring layer 41 may be set to be substantially the same as the average thickness of the lower layer land layer 25 and the lower winding layer 35 described above.

The layered area of the dummy wiring layer 41 in the base film 3 may be set as appropriate. For example, the lower limit of the ratio of the second area of the layered region of the dummy wiring layer 41 to the first area of the region up to 2 mm by the shortest distance from the wiring layer 11 toward its outside on the base film 3 is preferably 20% and is more preferably 25%. The upper limit of the ratio is preferably less than 50%, and is more preferably 40%. If the ratio is less than the lower limit, the electrical resistance of the wiring layer 11 may not be sufficiently reduced. On the other hand, when the ratio exceeds the upper limit, the electrical resistance of the wiring layer 11 may also not be sufficiently reduced. In addition, there is a possibility that the conduction failure may not be sufficiently reduced.

The shape of the dummy wiring layer 41 is not particularly limited and may be set as appropriate. For example, the dummy wiring layer 41 may be set to be a linear shape, other shapes, etc., when viewed in a direction perpendicular to the base film 3. The shape may be set as appropriate, for example, so as to satisfy the ratio of the above areas. For example, in the embodiment illustrated in FIG. 1, the dummy wiring layer 41 has a plurality of linear bodies.

Advantages

In the flexible printed circuit board 10, the ratio of the average thickness H2 of the land portion 13 to the average thickness H1 of the second winding portion 15b of the winding portion 15 is 1.1 or more and 5 or less. Since the ratio is within the above described range, the average thickness H2 of the land portion 13 is sufficiently large and the amount of metal layered on the inner peripheral surface of the hole 3a can be increased. Accordingly, a conduction failure at the through hole 20 can be reduced. Accordingly, the flexible printed circuit board 10 is excellent in the connection reliability.

In the present embodiment, the ratio of the average thickness H3 of the first winding portion 15a to the average thickness H1 of the second winding portion 15b of the winding portion 15 is 1.1 or more and 5 or less. Since the ratio is within the above described range, the average thickness H3 of the outermost circumferential first winding portion 15a is sufficiently large, and the electrical resistance of the first winding portion 15a can be reduced. Therefore, the electrical resistance of the wiring layer 11 can be reduced.

Method of Manufacturing Printed Circuit Board

Next, a method of manufacturing a flexible printed circuit board according to the present embodiment will be described with the flexible printed circuit board 10.

Figure 3:
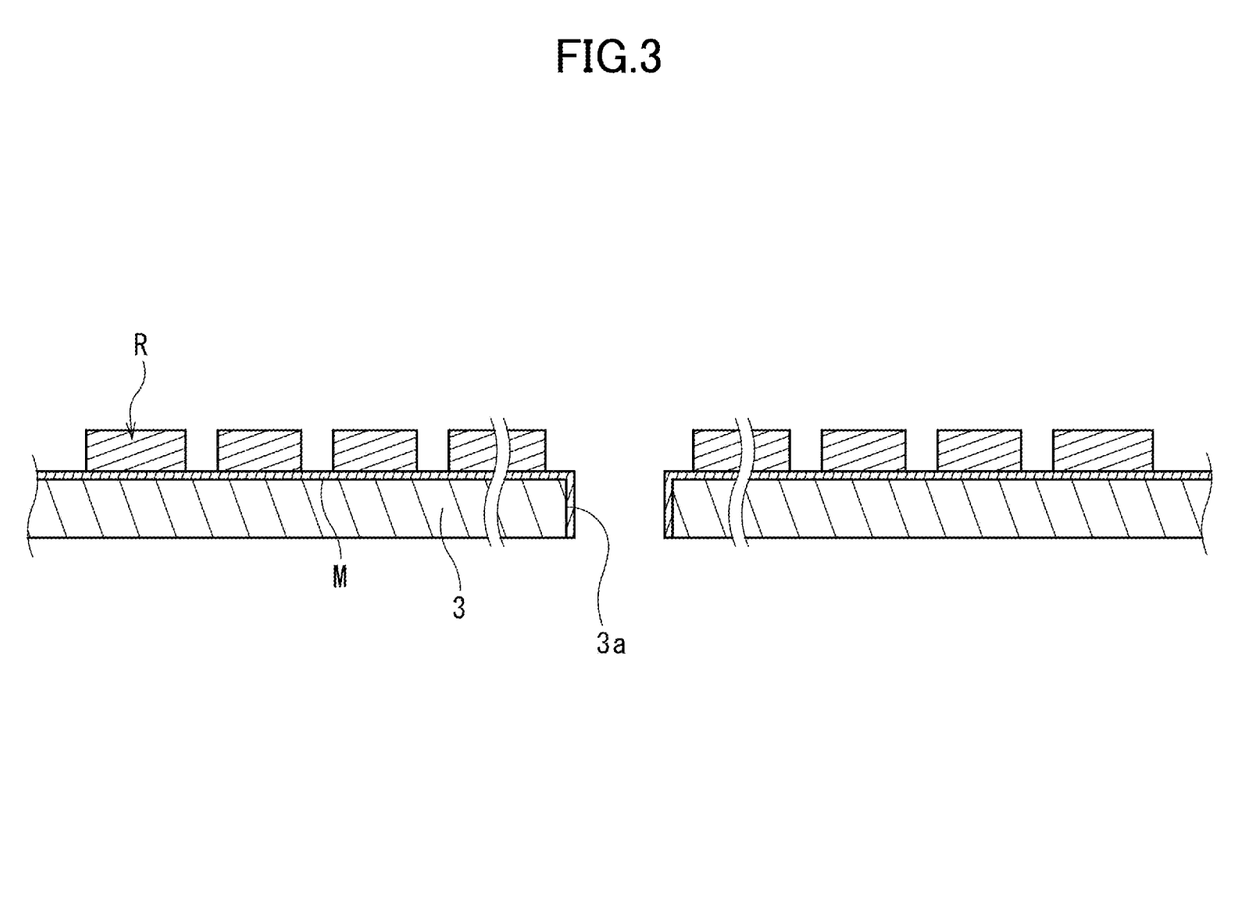
FIG. 3 is a schematic cross-sectional view for illustrating a method of manufacturing the flexible printed circuit board of FIG. 1 and FIG. 2, and is a schematic cross-sectional view viewed in the same direction as the AA arrow direction of FIG. 1.
Figure 4:
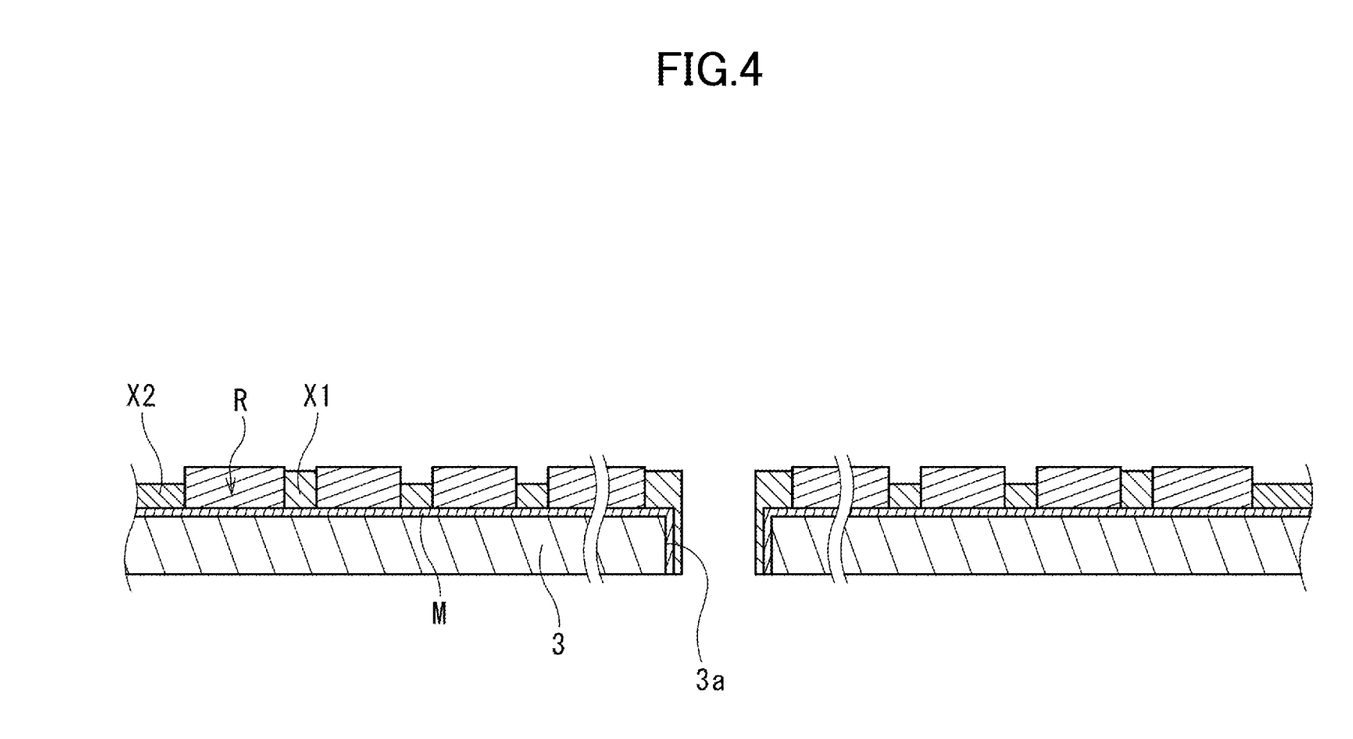
FIG. 4 is a schematic cross-sectional view for illustrating the method of manufacturing the flexible printed circuit board of FIG. 1 and FIG. 2, and is a schematic cross-sectional view viewed in the same direction as the AA arrow direction of FIG. 1.
Figure 5:
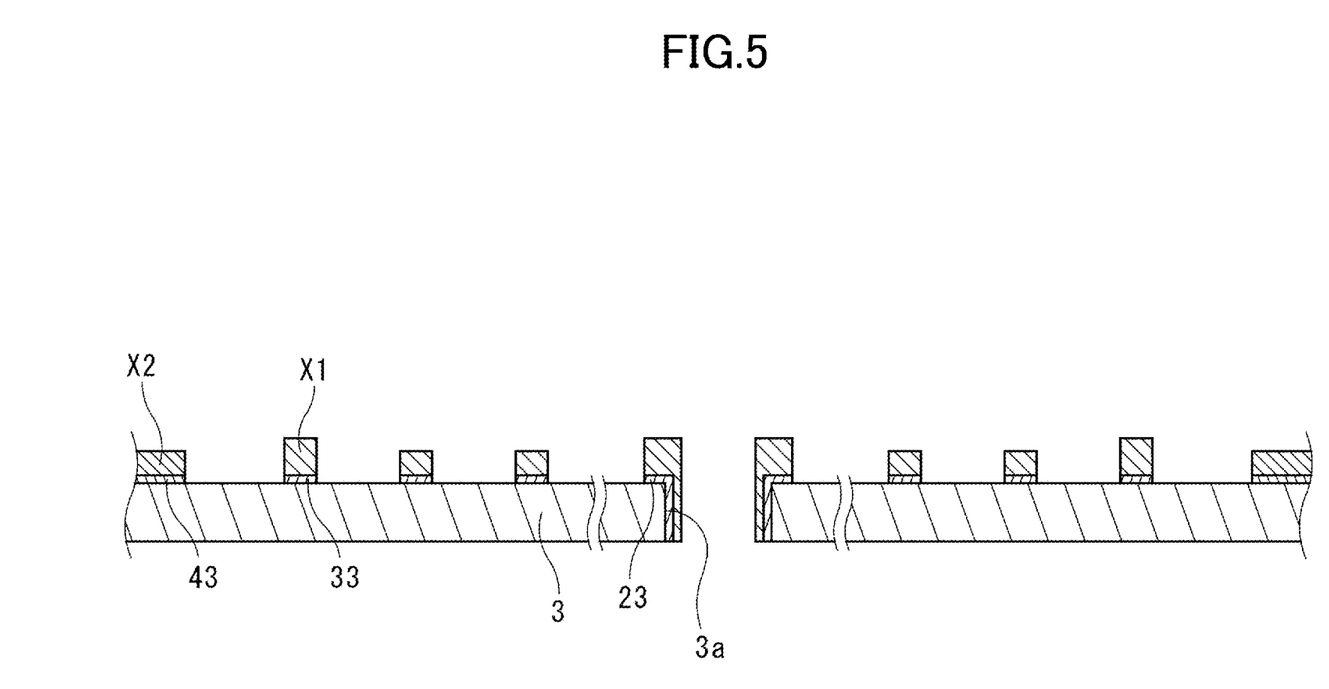
FIG. 5 is a schematic cross-sectional view for illustrating the method of manufacturing the flexible printed circuit board of FIG. 1 and FIG. 2, and is a schematic cross-sectional view viewed in the same direction as the AA arrow direction of FIG. 1.

The method of manufacturing the flexible printed circuit board 10 includes a first plating step of forming a first plating body X1 including the lower land layer 25 of the land portion 13 and the lower Winding layer 35 of the winding portion 15 by electroplating a first metal material on the conductive underlayer M of the base film 3 having the hole 3a for forming the through hole 20 using a resist pattern R, the conductive underlayer M being layered on one surface side (front surface side) of the base film 3; a removing step of removing, after the first plating step, the resist pattern R and a region of the conductive underlayer M on which the first plating body X1 is not layered; and a second plating step of forming, after the removing step, a second plating body X3 (not illustrated) including an upper land layer 27 of the land portion 13 and an upper winding layer 37 of the winding portion 15 by electroplating a second metal material on the first plating body X1. The land portion 13 is formed by a portion of the conductive underlayer M, the lower land layer 25 and the upper land layer 27, and the winding portion 15 is formed by another portion of the conductive underlayer M, the lower winding layer 35 and the upper winding layer 37.

In the present embodiment, in the first plating step, the first metal material is electroplated on the conductive underlayer M so that the second plating amount for forming the lower land layer 25 is greater than the first plating amount for forming the inside relative to the outermost circumference of the lower winding layer.

In addition, in the first plating step according to the present embodiment, a dummy plating body X2 corresponding to the dummy plating layer 45 is formed on the conductive underlayer M in addition to the first plating body X1. The dummy wiring layer 41 that is electrically isolated is formed by a portion of the region of the conductive underlayer M on which the first plating body X1 is not layered and the dummy plating body X2. As described above, by forming the dummy plating body X2 in the first plating step, the wiring layer 11 having a large average thickness H3 of the outermost circumferential first winding portion 15a is easily formed. Accordingly, it is possible to manufacture the flexible printed circuit board 10 that is further excellent in the connection reliability.

Conductive Underlayer

The conductive underlayer M is layered on the front surface of the base film 3. For the conductive underlayer M, one layered in advance on the entire surface of the front surface side the base film 3 is used. A portion of the conductive underlayer M becomes the first conductive underlayer 23, and another portion of the conductive underlayer M becomes the second conductive underlayer 33. Also, still another portion of the conductive underlayer M becomes the third conductive underlayer 43.

Examples of a material of forming the conductive underlayer M include copper (Cu), silver (Ag), gold (Au), nickel (Ni), titanium (Ti), chromium (Cr), alloys of these metals, stainless steel, and the like. For the material of forming the conductive underlayer M, it is preferable that the conductive underlayer M includes a layer (first layer) containing at least one kind selected from a group consisting of nickel, chromium, titanium, and silver on a side that is contact with the base film 3 (e.g., polyimide) in order to suppress thermal degradation of the adhesion force of the wiring layer 11 to the base film 3. Further, it is more preferable that the conductive underlayer M includes a layer (first layer) containing at least one kind selected from nickel and chromium that are easily removed and that easily maintain an insulating property. Additionally, it is more preferable that the conductive underlayer M includes a layer (second layer) containing, as the main component, copper on the upper side of the first layer (side opposite to the base film 3). By arranging a layer containing copper as the main component, the work time required for forming the wiring layer 11 by electroplating can be shortened.

For example, the lower limit of the average thickness of the first layer is preferably 1 nm and more preferably 2 nm. The upper limit of the average thickness of the first layer is preferably 15 nm and more preferably 8 nm. When the average thickness is less than the lower limit, it may be difficult to suppress thermal deterioration of the adhesion force of the wiring layer 11 to the base film 3. On the other hand, when the average thickness exceeds the upper limit, it may be difficult to remove the first layer, and the insulating property of the wiring layer 11 may not be sufficiently maintained. The first layer may be formed by a sputtering method, an electroplating method, an electroless plating method, or the like.

For example, the lower limit of the average thickness of the second layer is preferably 0.1 μm and more preferably 0.2 μm. The upper limit of the average thickness of the second layer is preferably 2 μm and more preferably 1 μm. If the average thickness is less than the lower limit, the time required for forming the wiring layer 11 by electroplating may be excessively long. If the average thickness exceeds the upper limit, the second layer may not be easily removed and the insulating property in the winding portion 15 may not be sufficiently maintained. The second layer is preferably formed by a sputtering method, an electroplating method, an electroless plating method, or the like, and may be formed by combining these methods. In particular, it is preferable that an electroless copper plating layer is disposed on the uppermost surface side of the conductive underlayer M, so that when the inner layer is formed by a sputtering method, a defect or the like that may be caused by the sputtering method can be covered.

First Plating Step

In this step, with a resist pattern forming step of forming a resist pattern R on the front surface of the conductive underlayer M and using the formed resist pattern R, the first metal material is electroplated on the conductive underlayer M, and thereby, a first plating body X1 having the lower land layer 25 of the land portion 13 and the lower winding layer 35 of the winding portion 15 and a dummy plating body X2 as the dummy plating layer 45 of the dummy wiring layer 41 are formed.

Resist Pattern Forming Step

In this step, as illustrated in FIG. 3, the resist pattern R is formed on the front surface of the conductive underlayer M. Specifically, by layering a resist film, such as a photosensitive film, on the surface of the conductive underlayer M and exposing and developing the layered resist film, the resist pattern R having a predetermined pattern is formed. Examples of the method of layering the resist film include a method of applying a resist composition to the surface of the conductive underlayer M and a method of layering the dry film photoresist to the surface of the conductive underlayer M. The exposure and development conditions of the resist film can be adjusted as appropriate depending on the resist composition or the like to be used. Openings of the resist pattern R may be set as appropriate in accordance with the first plating body X1 and the dummy plating body X2 to be formed, i.e., the lower land layer 25 and the lower winding layer 35 of the wiring layer 11, and the dummy plating layer 45 of the dummy wiring layer 41.

First Plating Body Forming Step

In this step, the first plating body X1 and the dummy plating body X2 are formed on the region of the conductive underlayer M on which the resist pattern R is not layered as illustrated in FIG. 4 by electroplating the first metal material while conducting the conductive underlayer M. At the time of forming the first plating body X1, the inner peripheral surface of the hole 3a is coated with the first metal material. In this step, the plating conditions are set so that the second plating amount for forming the lower land layer 25 is greater than the first plating amount for the inside relative to the outermost circumference of the lower winding layer 35. In addition, in this step, the plating conditions are set so that the third plating amount for forming the outmost circumference of the lower winding layer 35 is greater than the above described first plating amount.

For example, in the electroplating in this step, the above plating conditions can be adjusted by adjusting the jet flow rate of the plating solution in the electroplating bath, the air bubbling rate, and the like. For example, the lower limit of the jet flow rate is preferably 15 L/min and is more preferably 20 L/min. The upper limit of the jet flow rate is preferably less than 50 L/min and is more preferably 40 L/min. If the jet flow rate is less than the lower limit, the electrical resistance of the wiring layer 11 may not be sufficiently reduced. On the other hand, when the jet flow rate exceeds the upper limit, the electrical resistance of the wiring layer 11 may also not be sufficiently reduced. In addition, a conduction failure of the through hole 20 may occur.

For example, the lower limit of the air flow rate in air bubbling is preferably 15 L/min and is more preferably 20 L/min. The upper limit of the air flow rate is preferably 50 L/min and is more preferably 40 L/min. When the air flow rate is less than the lower limit, the electrical resistance of the wiring layer 11 may not be sufficiently reduced. On the other hand, when the air flow rate exceeds the upper limit, the electrical resistance of the wiring layer 11 may also not be sufficiently reduced. In addition, a conduction failure of the through hole 20 may occur.

In this first plating step, as illustrated in FIG. 4, on the conductive underlying layer M of the base film 3, the first plating body X1 is formed in which the average thickness of the inside end portion (corresponding to the lower layer land layer 25) is larger than the average thickness of the inside relative to the outer circumference (corresponding to the inside relative to the outer circumference of the lower winding layer 35), and the average thickness of the outermost circumference (corresponding to the outermost circumference of the lower winding layer 35) is larger than the average thickness of the inside. In addition, the dummy plating body X2 (corresponding to the dummy plating layer 45) is formed on the conductive underlayer M of the base film 3.

Removing Step

This step includes a peeling step of peeling off the resist pattern R from the conductive underlayer M and an etching step of etching a region (unnecessary region) of the conductive underlayer M on which the first plating body X1 and the dummy plating body X2 are not layered.

Peeling Step

In this step, the resist pattern R is peeled off from the conductive underlayer M. As the peeling solution, a known solution can be used. For example, an alkaline aqueous solution such as sodium hydroxide and potassium hydroxide, an organic acid-based solution such as alkylbenzenesulfonic acid, and a mixture liquid of an organic amine such as ethanolamine and a polar solvent can be used.

Etching Step

In this step, the conductive underlayer M is etched with the first plating body X1 and the dummy plating body X2 as a mask. By this etching, a first layered body is obtained in which the first plating body X1 is layered over the base film 3 via the first conductive underlayer 23 and the second conductive underlayer 33 as illustrated in FIG. 5. Further, a second layered body is obtained in which the dummy plating body X2 is layered over the base film 3 via the third conductive underlayer 43. In the etching, an etching solution that erodes the metal forming the conductive underlayer M is used. Thus, a semi-additive method is preferably used in the manufacturing method.

Second Plating Step

In this step, the third plating body X3 (not illustrated) including the upper land layer 27 of the land portion 13 and the upper winding layer 37 of the winding portion 15 is formed by electroplating the second metal material while conducting the first plating body X1 after the removing step described above. In this step, for example, the second metal material is electroplated on the first plating body X1 under predetermined constant plating conditions. Accordingly, the amount of plating on the first plating body X1 can be set to a constant amount (thickness) as a whole.

In this second plating step, as illustrated in FIG. 2 with reference to FIG. 5, a first layered body (corresponding to the wiring layer 11) is obtained that is formed by layering, on the base film 3, the first conductive underlayer 23 and the second conductive underlayer 33, the first plating body X1 including the lower land layer 25 and the lower winding layer 35, and the second plating body X3 (not illustrated) including the upper land layer 27 and the upper winding layer 37. Also, a second layered body (corresponding to the dummy wiring layer 41), which is formed by layering the third conductive underlayer 43 and the dummy plating body X2 (corresponding to the dummy plating layer 45) on the base film 3, is obtained.

Advantages

According to the method of manufacturing the flexible printed circuit board 10, the flexible printed circuit board 10 described above can be manufactured. That is, the flexible printed circuit board 10 excellent in the connection reliability can be manufactured.

Other Embodiments

The embodiments disclosed herein should be considered to be examples in all respects and non-restrictive. The scope of the present invention is not limited to the configuration of the above-described embodiments. The scope of the present invention is set forth by the appended claims, and it is intended to include all modifications within the scope of the claims and equivalents.

In the above-described embodiments, a flexible printed circuit board including a single base film and a wiring layer layered on one side of the base film has been described, but the flexible printed circuit board may be a flexible printed circuit board in which multiple wiring layers are layered on both sides of the single base film. The flexible printed circuit board may also be a multi-layer printed circuit board including multiple base films each having multiple wiring layers on either one side or both sides.

In this case, the wiring layers on both surfaces can be conducted through a land portion.

Although a case has been described in which a single wiring layer is layered on a base film in the embodiment described above, a plurality of wiring layers may be layered with intervals from each other on the base film.

Although a case has been described in which a dummy wiring layer is disposed in the embodiment described above, a configuration in which a dummy wiring layer is not disposed may be employed.

EXAMPLES

Although the present disclosure will be described in more detail with the following Examples, the present disclosure is not limited to the following Examples.

Preparation of Sample

A film (UPILEX, manufactured by Ube Industries, Ltd.) obtained by layering a conductive underlayer on one surface side (front surface side) of a base film having a hole for forming a through hole was used. On the conductive underlayer of the film, a single wiring layer having a coil shape of a predetermined shape as illustrated in FIG. 1 and FIG. 2 described above and a dummy wiring layer with linear striatum were formed. Specifically, using a resist pattern as described above, while being in conduction with the conductive underlayer, by electroplating, on the conductive underlayer, a copper material as the first metal material in an electroplating bath, a first plating body for the wiring layer and a dummy plating body for the dummy wiring layer were formed. In this electroplating, the same conditions were set except that the jet flow rate of the plating solution in the electroplating bath and the air rate of the air bubbling were set as illustrated in Table 1 below. Then, while conducting the first plating body, a copper material, which is the same as the first metal material, was electroplated as a second metal material on the first plating body under predetermined constant conditions in the electroplating bath to prepare samples of Experimental Examples 1 to 4 as indicated in Table 1.

Evaluation

Average Thickness

For the samples of Experimental Examples 1 to 4, the average thickness H1 of the second winding portion, which is inside relative to the outermost circumference, in the winding portion, the average thickness H2 of the land portion, and the average thickness H3 of the first winding portion at the outermost circumference in the winding portion were measured. Specifically, a cross-section of each sample was exposed by a cross-sectional processing device such as a microtome, the thickness for each of the second winding portion, the land portion, and the first winding portion was measured by cross-sectional observation at desired ten points, and the average values of the measurement results were calculated to obtain the average thickness H1 of the second winding portion, the average thickness H2 of the land portion, and the average thickness H3 of the first winding portion, respectively. After this measurement, the ratio of the average thickness H2 of the land portion to the average thickness H1 of the second winding portion and the ratio of the average thickness H3 of the first winding portion to the average thickness H1 of the second winding portion were calculated. The results are indicated in Table 1.

Ratio of Second Area to First Area

For the samples of Experimental Examples 1 to 4, the ratio of the second area of the layered region of the dummy wiring layer to the first area of the region of 2 mm from the wiring layer toward its outside on the base film was measured. This ratio was calculated by measuring the area of the dummy wiring layer and the area of the exposed portion of the conductive underlayer after resist formation. The results are indicated in Table 1.

Conductivity

The samples of Experimental Examples 1 to 4 were subjected to an electrical inspection. As a result, an open part was determined as being defective. The results are indicated in Table 1.

Reduction Rate of Electrical Resistance

The electrical resistance of the samples of Experimental Examples 1 to 4 was measured by electrical inspection. The reduction rate of the electrical resistance of Experiment Examples 1 to 4 was calculated relative to the obtained electrical resistance (reference) of Experiment Example 4. The results are indicated in Table 1.

be reduced when the ratio of the average thickness H3 of the first winding portion to the average thickness H1 of the second winding portion is 1.1 or more and 5 or less.

INDUSTRIAL APPLICABILITY

The flexible printed circuit board according to the embodiments of the present disclosure, and the flexible printed circuit board manufactured by the method of manufacturing the flexible printed circuit board are excellent in the connection reliability. Therefore, it can be suitably used in, for example, small electronic devices.

DESCRIPTION OF THE REFERENCE NUMERALS

10 Flexible Printed Circuit boards
3 Base film
3a Hole
11 Wiring layer
13 Land portion
15 Winding portion
20 Through hole
23 First conductive underlayer
25 Lower land layer
27 Upper land layer
33 Second conductive underlayer
35 Lower winding layer
37 Upper winding layer
41 Dummy wiring layer
43 Third conductive underlayer
45 Dummy plating layer
H1 Average thickness of second winding portion
H2 Average thickness of land portion
H3 Average thickness of first winding portion
L Average line width of winding portion
S Average interval of winding portion
M Conductive underlayer
R Resist pattern
X1 First plating body
X2 Dummy plating body

The invention claimed is:
1. A flexible printed circuit board comprising:
a base film having a hole for forming a through hole; and
a coil-shaped wiring layer layered on at least one surface side of the base film,
wherein the wiring layer includes a land portion arranged at an inner peripheral surface of the hole and at a peripheral portion of the hole of the base film, and a

TABLE 1

| | H3/H1 [—] | H2/H1 [—] | RATIO OF SECOND AREA TO FIRST AREA [%] | JET FLOW RATE [L/m] | AIR FLOW RATE [L/m] | CONDUCTION FAILURE | ELECTRICAL RESISTANCE REDUCTION RATE [%] |
|---|---|---|---|---|---|---|---|
| EXPERIMENTAL EXAMPLE 1 | 1.2 | 1.3 | 0 | 25 | — | NONE | 12 |
| EXPERIMENTAL EXAMPLE 2 | 1.1 | 1.3 | 30 | 25 | — | NONE | 5 |
| EXPERIMENTAL EXAMPLE 3 | 1.1 | 1.1 | 30 | 25 | 30 | 2 ppm | 5 |
| EXPERIMENTAL EXAMPLE 4 | 1.0 | 1.0 | 50 | 50 | 30 | 13 ppm | REFERENCE |

As indicated in Table 1, it was indicated that the conduction failure may be reduced when the ratio of the average thickness H2 of the land portion to the average thickness H1 of the second winding portion is 1.1 or more and 5 or less. In addition, it was indicated that the electrical resistance may winding portion arranged in a spiral shape with the land portion as an inside end portion or an outside end portion, wherein the winding portion includes a first winding portion that is an outermost circumference and a second winding portion that is inside relative to the outermost circumference, wherein a ratio of an average thickness of the land portion to an average thickness of the second winding portion is 1.1 or more and 5 or less, and wherein the average thickness of the land portion is greater than or equal to 20 μm.

2. The flexible printed circuit board according to claim 1, wherein a ratio of an average thickness of the first winding portion to the average thickness of the second winding portion is 1.1 or more and 5 or less.

3. The flexible printed circuit board according to claim 2, further comprising a dummy wiring layer that is arranged in a region outside the wiring layer on the base film with an interval from the wiring layer.

4. A flexible printed circuit board comprising:
a base film having a hole for forming a through hole;
a coil-shaped wiring layer layered on at least one surface side of the base film; and
a dummy wiring layer that is arranged in a region outside the wiring layer on the base film with an interval from the wiring layer,
wherein the wiring layer includes a land portion arranged at an inner peripheral surface of the hole and at a peripheral portion of the hole of the base film, and a winding portion arranged in a spiral shape with the land portion as an inside end portion or an outside end portion,
wherein the winding portion includes a first winding portion that is an outermost circumference and a second winding portion that is inside relative to the outermost circumference,
wherein a ratio of an average thickness of the land portion to an average thickness of the second winding portion is 1.1 or more and 5 or less,
wherein a ratio of an average thickness of the first winding portion to the average thickness of the second winding portion is 1.1 or more and 5 or less, and
wherein a ratio of a second area of a layered region of the dummy wiring layer to a first area of a region up to 2 mm by a shortest distance from the wiring layer toward outside thereof in the base film is 20% or more and less than 50%.

5. A method of manufacturing a flexible printed circuit board including a base film having a hole for forming a through hole; and a coil-shaped wiring layer layered on at least one surface side of the base film,
wherein the wiring layer includes a land portion arranged at an inner peripheral surface of the hole and at a peripheral portion of the hole of the base film, and a winding portion arranged in a spiral shape with the land portion as an inside end portion or an outside end portion,
wherein the winding portion includes a first winding portion that is an outermost circumference and a second winding portion that is inside relative to the outermost circumference, wherein a ratio of an average thickness of the land portion to an average thickness of the second winding portion is 1.1 or more and 5 or less, and wherein the average thickness of the land portion is greater than or equal to 20 μm, wherein the method comprises:
forming a first plating body including a lower land layer of the land portion and a lower winding layer of the winding portion by electroplating a first metal material on a conductive underlayer of the base film having the hole for forming the through hole using a resist pattern, the conductive underlayer being layered on at least one surface side of the base film;
removing, after the forming of the first plating body, the resist pattern and a region of the conductive underlayer on which the first plating body is not layered; and
forming, after the removing, a second plating body including an upper land layer of the land portion and an upper winding layer of the winding portion by electroplating a second metal material on the first plating body;
wherein in the forming of the first plating body, the first metal material is electroplated on the conductive underlayer so that a second plating amount for forming the lower land layer is greater than a first plating amount for forming an inside relative to the outermost circumference of the lower layer winding layer,
wherein the land portion is formed by a portion of the conductive underlayer, the lower land layer and the upper land layer, and
wherein the winding portion is formed by another portion of the conductive underlayer, the lower winding, layer and the upper winding layer.

6. The method of manufacturing the flexible printed circuit board according to claim 5,
wherein the flexible printed circuit board further includes a dummy wiring layer that is arranged in a region outside the wiring layer on the base film with an interval from the wiring layer,
wherein in the forming of the first plating body, a dummy plating body is formed on the conductive underlayer in addition to the first plating body, and
wherein the dummy wiring layer that is electrically isolated is formed by a portion of a region of the conductive underlayer on which the land portion or the winding portion is not layered and by the dummy plating body.

7. The flexible printed circuit board according to claim 1, wherein the land portion includes a conductive underlayer and a lower land layer, and the conductive underlayer and the lower land layer are layered on the inner peripheral surface of the hole.

8. The flexible printed circuit board according to claim 1, wherein the land portion includes a conductive underlayer and a lower land layer, and the conductive underlayer and the lower land layer are layered on the inner peripheral surface of the hole, the lower land layer being formed by electroplating a first metal material on the conductive underlayer.

* * * * *